(12) United States Patent
Sylvestre et al.

(10) Patent No.: US 9,761,542 B1
(45) Date of Patent: Sep. 12, 2017

(54) LIQUID METAL FLIP CHIP DEVICES

(71) Applicant: INTERNATIONAL BUSINESS MACHINES CORPORATION, Armonk, NY (US)

(72) Inventors: Julien Sylvestre, Sherbrooke (CA); Assane Ndieguene, Sherbrooke (CA); Pierre Albert, Sherbrooke (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/258,476

(22) Filed: Sep. 7, 2016

(51) Int. Cl.
*H01L 23/495* (2006.01)
*H01L 23/00* (2006.01)
(Continued)

(52) U.S. Cl.
CPC .......... *H01L 23/562* (2013.01); *B23K 1/0016* (2013.01); *B23K 35/0244* (2013.01); *B23K 35/26* (2013.01); *B23K 35/362* (2013.01); *C22C 28/00* (2013.01); *H01L 21/4853* (2013.01); *H01L 21/563* (2013.01); *H01L 23/296* (2013.01); *H01L 23/3157* (2013.01); *H01L 23/49838* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *B23K 2201/40* (2013.01); *H01L 2224/0345* (2013.01); *H01L 2224/0401* (2013.01); *H01L 2224/05155* (2013.01); *H01L 2224/05166* (2013.01); *H01L 2224/05181* (2013.01); *H01L 2224/05184* (2013.01); *H01L 2224/11462* (2013.01); *H01L 2224/13026* (2013.01); *H01L 2224/13105* (2013.01); *H01L 2224/13109* (2013.01); *H01L 2224/16237* (2013.01); *H01L 2224/81011* (2013.01); *H01L 2224/8112* (2013.01); *H01L 2224/81815* (2013.01); *H01L 2924/351* (2013.01)

(58) Field of Classification Search
CPC . H01L 21/4853; H01L 21/563; H01L 23/562; H01L 23/296; H01L 23/3157; H01L 24/03; H01L 24/05; H01L 24/11; H01L 24/13; H01L 24/16; H01L 24/81; H01L 2224/0345; B23K 1/0016; B23K 35/0244; B23K 35/26; B23K 35/362; C22C 28/00
See application file for complete search history.

(56) References Cited

U.S. PATENT DOCUMENTS 8,026,583 B2  9/2011  Weissbach et al.
8,143,096 B2  3/2012  Park et al.
(Continued)

*Primary Examiner* — Yosef Gebreyesus
(74) *Attorney, Agent, or Firm* — Cantor Colburn LLP; Steven Meyers

(57) ABSTRACT

Embodiments of the present invention provide an improved method and structure for flip chip implementation. The interconnections between the electronic circuit (e.g. silicon die) and the circuit board substrate are comprised of a metal alloy that becomes liquid at the operating temperature of the chip. This allows a softer underfill to be used, which in turn reduces stresses during operation and thermal cycling that are caused by the different coefficient of thermal expansion (CTE) of the electronic circuit chip and the circuit board substrate.

20 Claims, 7 Drawing Sheets

(51) Int. Cl.
*H01L 23/498* (2006.01)
*H01L 23/31* (2006.01)
*H01L 23/29* (2006.01)
*H01L 21/48* (2006.01)
*H01L 21/56* (2006.01)
*B23K 1/00* (2006.01)
*B23K 35/26* (2006.01)
*B23K 35/02* (2006.01)
*C22C 28/00* (2006.01)
*B23K 35/362* (2006.01)
*B23K 101/40* (2006.01)

(56) References Cited

U.S. PATENT DOCUMENTS

| | | | |
|---|---|---|---|
| 9,153,530 B2 | 10/2015 | Zhong et al. | |
| 2006/0292824 A1* | 12/2006 | Beyne | B81C 1/00333 |
| | | | 438/455 |
| 2009/0266447 A1* | 10/2009 | Busby | B23K 35/262 |
| | | | 148/24 |
| 2011/0309481 A1 | 12/2011 | Huang et al. | |
| 2013/0115735 A1 | 5/2013 | Chen et al. | |
| 2014/0061889 A1* | 3/2014 | Noma | H01L 21/563 |
| | | | 257/700 |

* cited by examiner

US 9,761,542 B1

LIQUID METAL FLIP CHIP DEVICES

FIELD OF THE INVENTION

The present invention relates generally to electronics fabrication, and more particularly, to liquid metal flip chip devices.

BACKGROUND

The number of electronic devices continues to increase. Furthermore, electronic devices are becoming more mobile, and at the same time, more powerful. Thus, many transistors are being packaged into devices for communication, general computing, consumer electronics, and other areas. A flip chip device is an electronic chip that is installed on a circuit board, with connections between the chip and the circuit board formed by solder bumps rather than wires. Flip chip devices are playing an important role in the realization of products for these areas. Thus, more than ever before, reliability and durability in electronics fabrication is important.

A significant issue in modern flip chip packaging is the tight interconnection via an array of solder joints of two structures made of widely different materials: the silicon integrated circuit device, and the organic laminate substrate. The solder joints must be protected from fatigue damage resulting from different thermal strains in the device and substrate, using a stiff underfill material. The underfill tightly couples the device to the substrate, therefore reducing the strain on the solder joints, but at the cost of creating significant problems elsewhere. These problems include package warpage, strain on the thermal interface layer, underfill adhesion and cracking in thermal cycling, among others. Thus, as a chip is powered on and off many times over its lifetime, the thermal cycling can cause problems that can impact reliability. Therefore, it is desirable to have improvements in flip chip devices.

SUMMARY

In a first aspect, embodiments provide a structure for flip chip connection between an electronic circuit chip and a circuit board substrate comprising: a plurality of under-bump metallurgy (UBM) pads disposed on the electronic circuit chip; a plurality of surface mount pads disposed on the circuit board substrate, wherein each UBM pad of the plurality of UBM pads is associated with a corresponding surface mount pad from the plurality of surface mount pads; a plurality of solder joints, wherein each solder joint is disposed between a UBM pad from the plurality of UBM pads and a corresponding surface mount pad; an underfill material disposed around the plurality of solder joints between the electronic circuit chip and the circuit board substrate; wherein the plurality of solder joints are comprised of a metal alloy, wherein the metal alloy has a melting temperature that is lower than an operating temperature of the electronic circuit chip.

In another aspect, embodiments provide a method for making a flip chip connection between an electronic circuit chip and a circuit board substrate comprising: forming a plurality of under-bump metallurgy (UBM) pads on the electronic circuit chip; forming a plurality of surface mount pads on the circuit board substrate; forming a plurality of solder joints by applying a metal alloy to at least one of the plurality of UBM pads and the plurality of surface mount pads, wherein the metal alloy has a melting temperature that is lower than an operating temperature of the electronic circuit chip; aligning the plurality of UBM pads to the plurality of surface mount pads; performing an oxide removal on the metal alloy; heating the metal alloy above the melting temperature; and applying an underfill material such that the underfill material is disposed around the plurality of solder joints between the electronic circuit chip and the circuit board substrate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
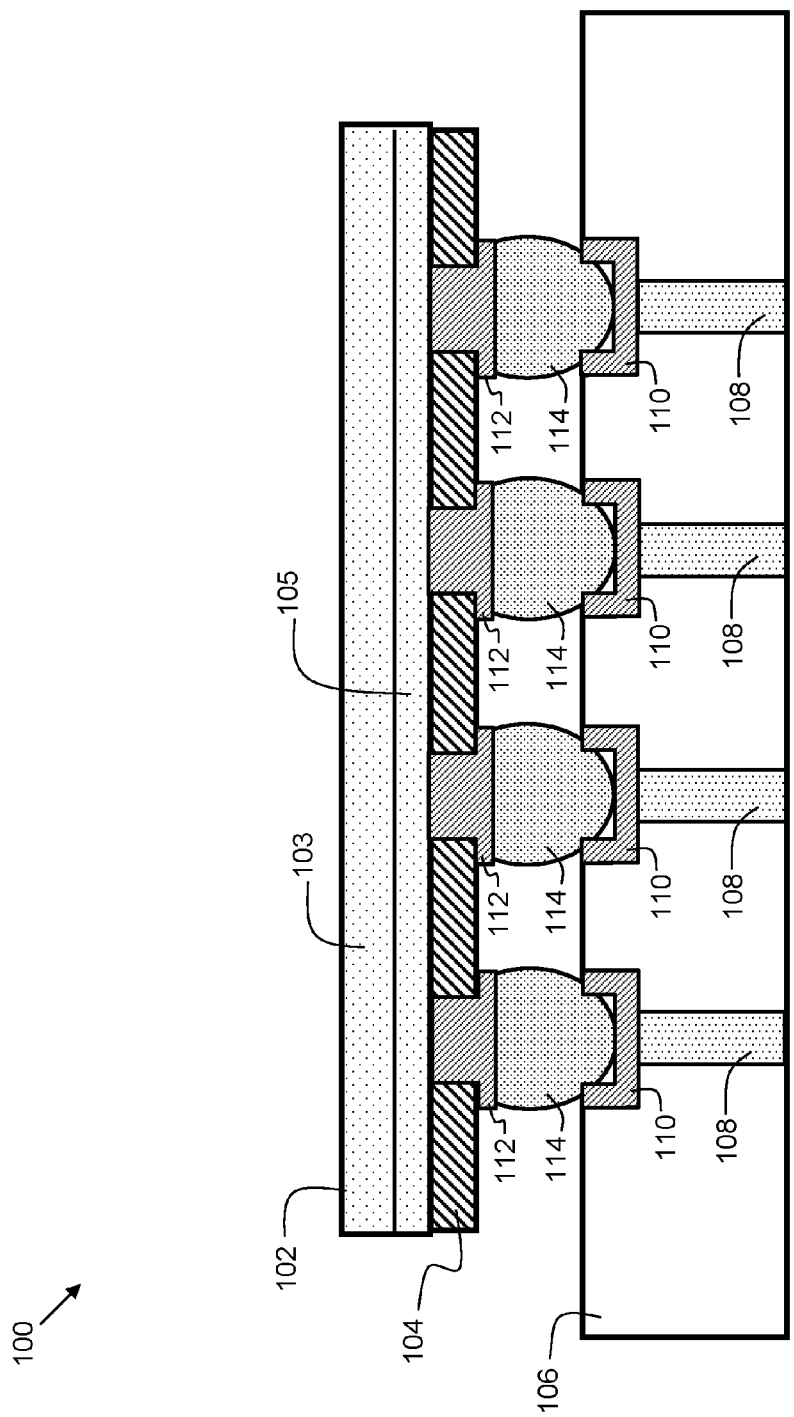

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a structure at a starting point for embodiments of the present invention.

Figure 2:
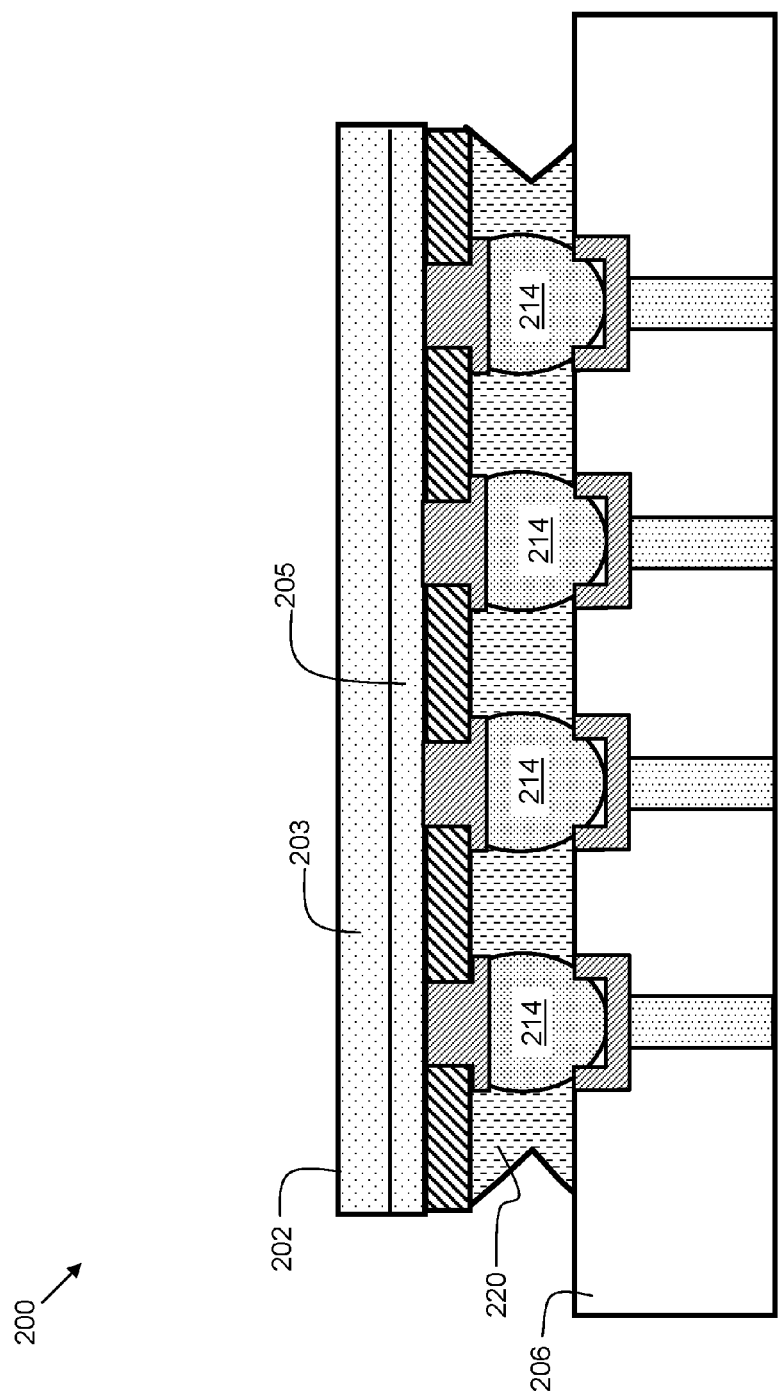

FIG. 2 is a structure after a subsequent process step of applying a flux.

Figure 3:
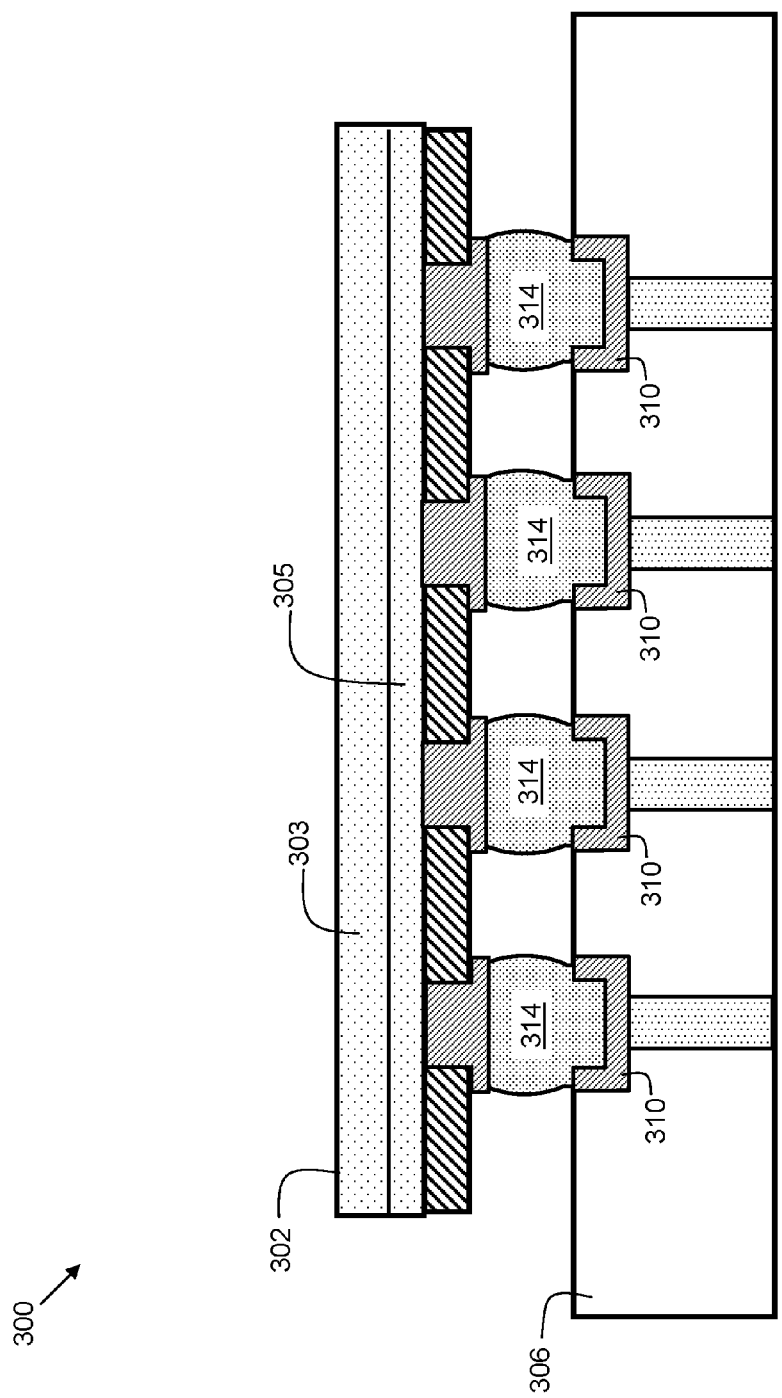

FIG. 3 is a structure after a subsequent step of metal alloy flow.

Figure 4:
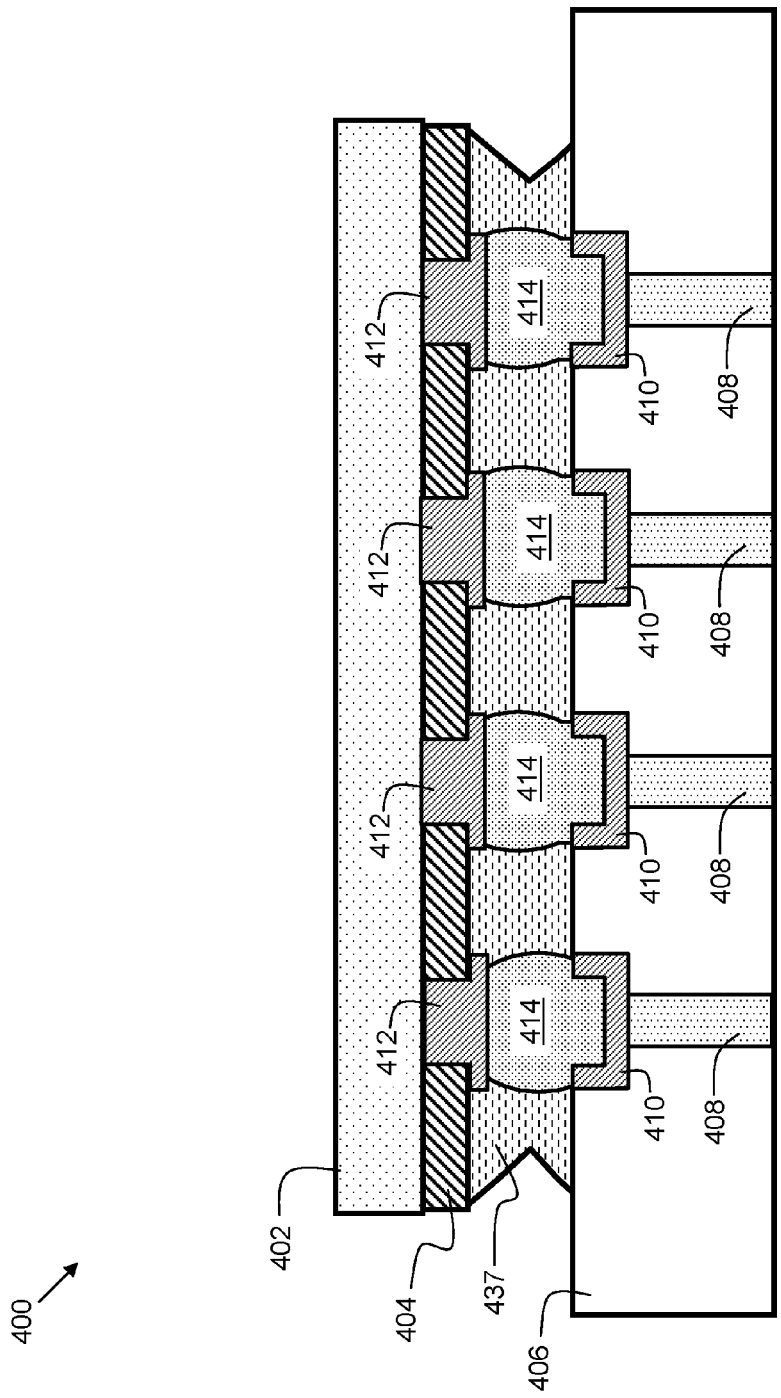

FIG. 4 is a structure in accordance with embodiments of the present invention including an underfill.

Figure 5:
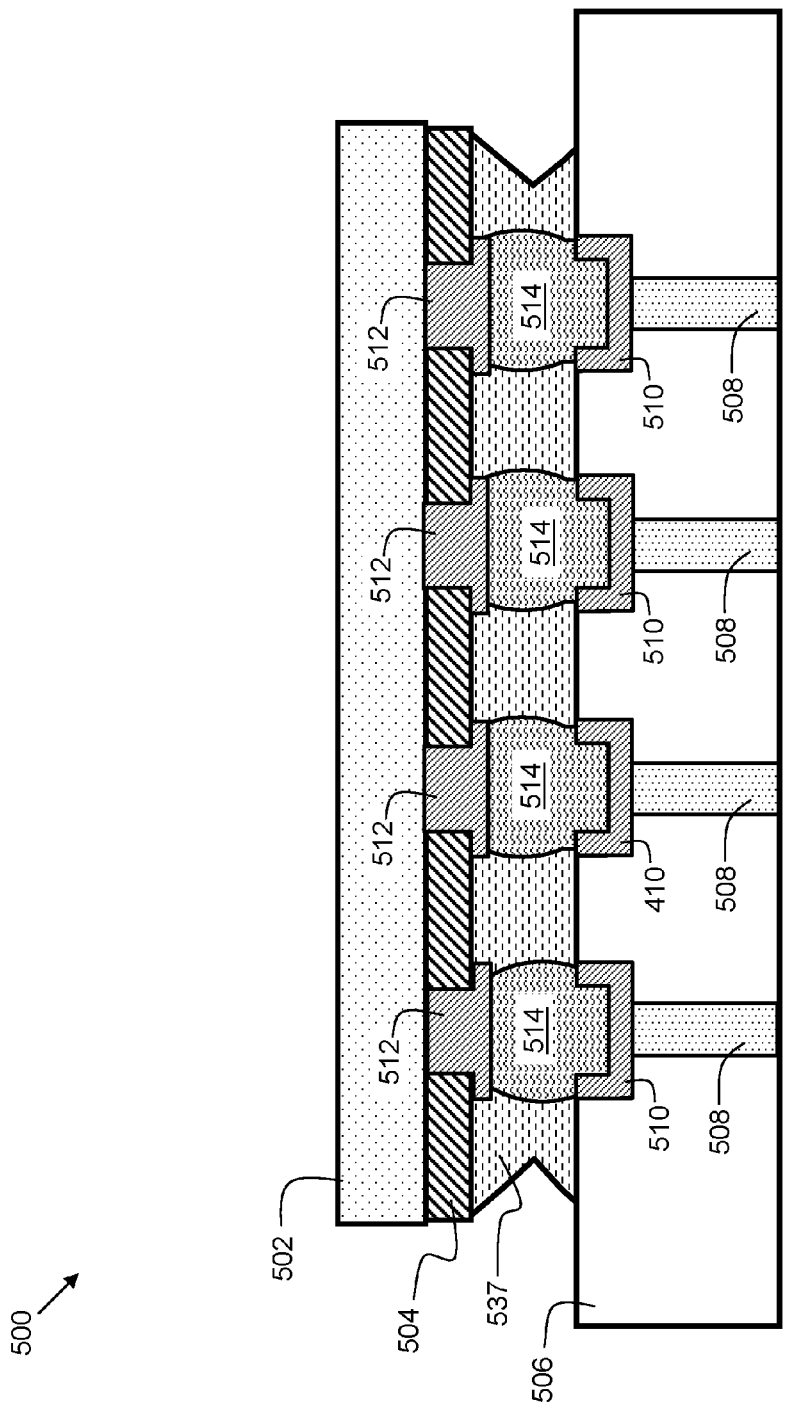

FIG. 5 is a structure in accordance with embodiments of the present invention during operation.

Figure 6:
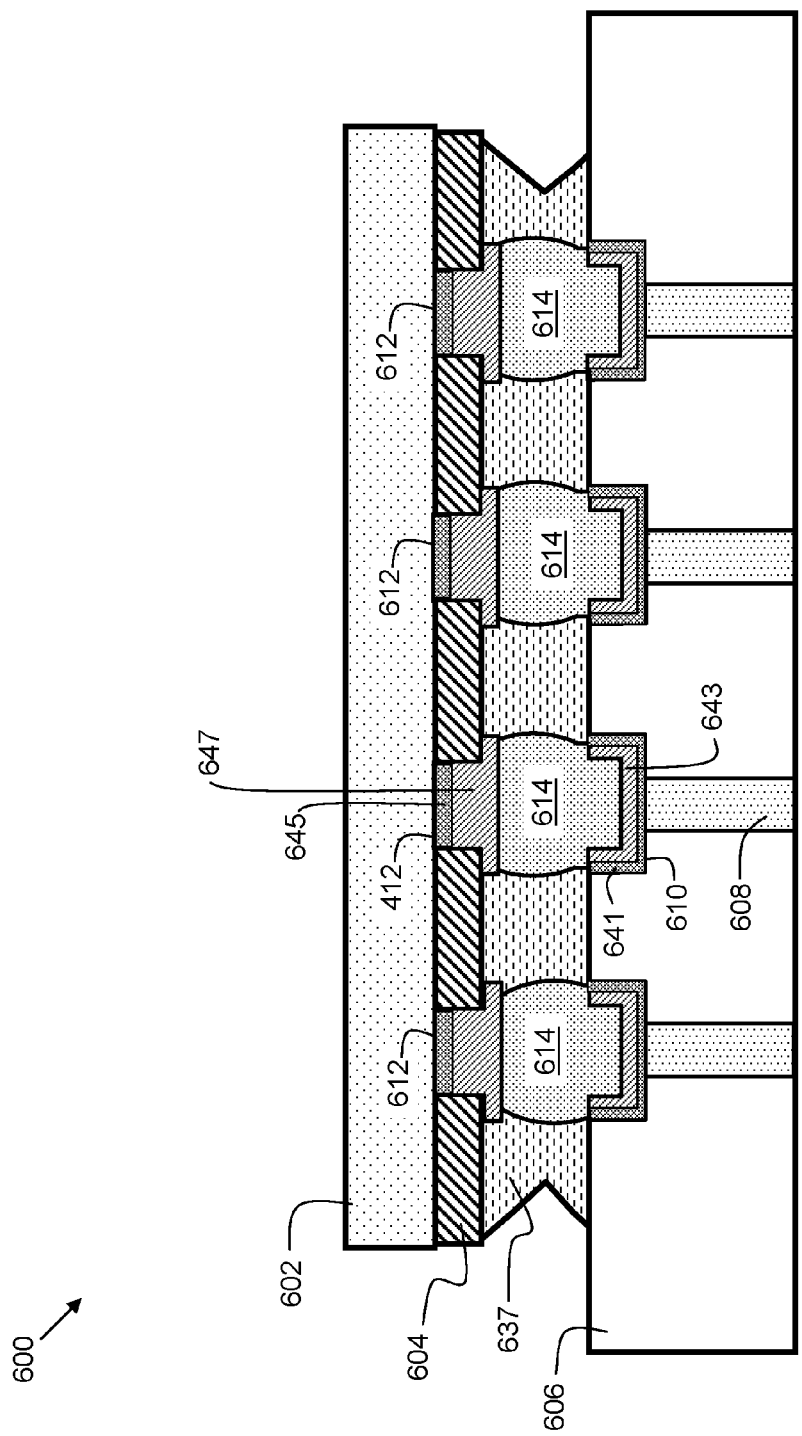

FIG. 6 is a structure in accordance with additional embodiments of the present invention including an adhesion layer.

Figure 7:
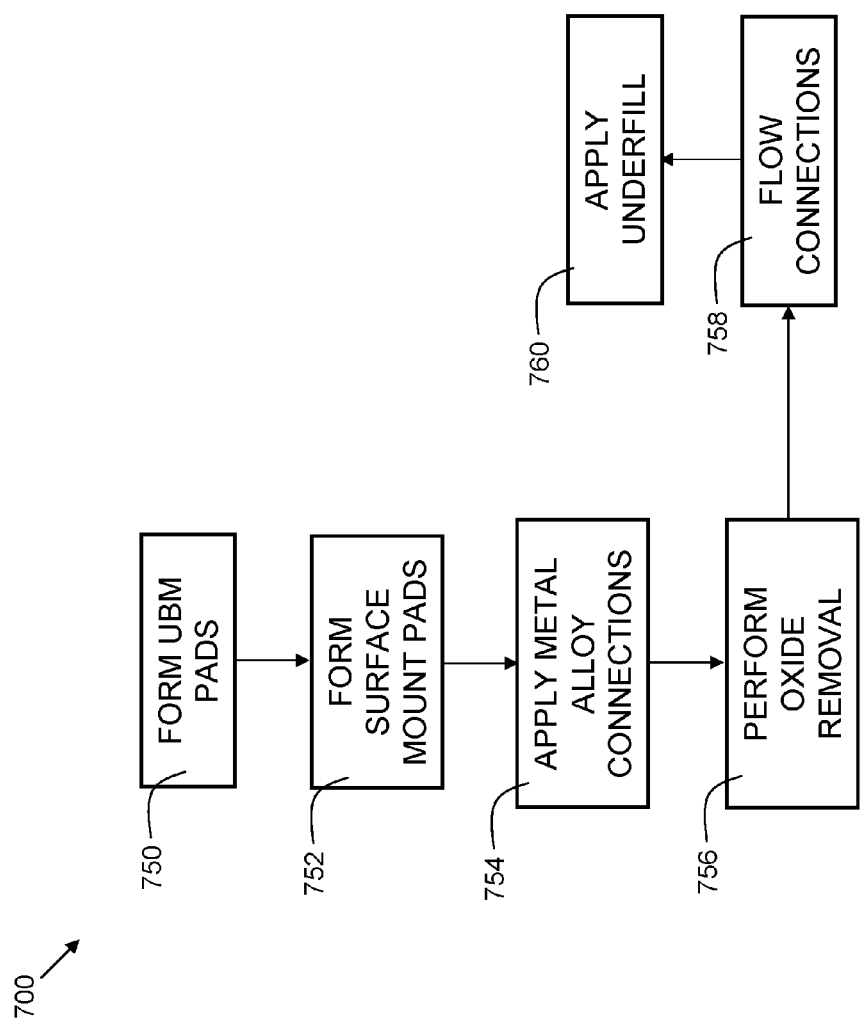

FIG. 7 is a flowchart indicating process steps for embodiments of the present invention.

DETAILED DESCRIPTION

Embodiments of the present invention provide an improved method and structure for flip chip implementation. The interconnections between the electronic circuit (e.g. silicon die) and the circuit board substrate are comprised of a metal alloy that becomes liquid at the operating temperature of the chip. This allows a softer underfill to be used, which in turn reduces stresses during operation and thermal cycling that are caused by the different coefficient of thermal expansion (CTE) of the electronic circuit chip and the circuit board substrate.

A traditional flip chip device utilizes an interconnection that is solid during operation of the chip. For example, a tin-based alloy, which is commonly used as a flip chip interconnection, is rigid, and thus sensitive to mechanical stress. In order to protect these interconnections, a stiff underfill material is used. While this protects the interconnections, it also causes other problems such as package warpage, strain on the thermal interface layer, underfill adhesion and cracking in thermal cycling, among others. In embodiments of the present invention, the interconnections are comprised of materials that have a melting point (melting temperature) that allows them to be solid at various phases of the manufacturing process, but liquid during the operation of the device. The liquid interconnections are resilient to mechanical stress, and thus allow the use of the softer underfills that alleviate stresses due to thermal cycling. Thus embodiments of the present invention provide a flip chip connection that can offer improved reliability, especially in applications where frequent thermal cycling occurs. In embodiments, the interconnections are comprised of gallium, or a gallium indium alloy.

This disclosure may be embodied in a variety of different forms and should not be construed as limited to the exemplary embodiments described herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this disclosure to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily all refer to the same embodiment.

The terms "over" or "atop", "positioned on" or "positioned atop", "under", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 is a structure 100 at a starting point for embodiments of the present invention. Structure 100 comprises an electronic circuit chip 102. In embodiments, the electronic circuit chip 102 is an integrated circuit (IC) chip. The electronic circuit chip 102 may be comprised of silicon, silicon germanium, sapphire, or other suitable material. The electronic circuit chip 102 may be formed as a bulk substrate, or as a semiconductor-on-insulator (SOI) substrate. The electronic circuit chip 102 may comprise one or more metallization layers (not shown) to interconnect multiple transistors and passive elements (not shown) within the circuit chip 102. Thus the circuit chip 102 may include a Front End Of Line (FEOL) section 103 that comprises multiple transistors and a Back End Of Line (BEOL) section 105 that includes one or more metallization layers. A passivation layer 104 is disposed on the BEOL section 105 of the electronic circuit chip 102. In embodiments, the passivation layer 104 may be comprised of a nitride layer, and more specifically, may be comprised of $Si_3N_4$. Also disposed on the circuit chip 102, and traversing the passivation layer 104, are a plurality of under-bump metallurgy (UBM) pads 112. Connected to the UBM pads 112 are a plurality of solder joints 114. As shown in FIG. 1, the solder joints 114 have not yet been reflowed, and thus are in a solid form. The solder joints 114 are positioned over a circuit board substrate 106. In embodiments, the circuit board substrate 106 may be comprised of a plastic material, an organic material, and can be a laminate, or other suitable material. The circuit board substrate 106 comprises a plurality of corresponding surface mount pads 110. Each surface mount pad 110 is associated with (connected to) a corresponding circuit board interconnection 108. In embodiments, the circuit board interconnections 108 are comprised of copper, and may be used to route electronic signals and/or power to/from other parts of the circuit board substrate 106.

Each surface mount pad 110 has a corresponding UBM pad 112 to which it is connected by a solder joint 114. In embodiments, the solder joints are comprised of gallium, or a gallium indium alloy. In some embodiments, each solder joint 114 comprises from 1 percent to 90 percent Indium by weight. In particular embodiments, the solder joints 114 comprise 25 percent indium by weight. In some embodiments, the solder joints are pure gallium.

Since gallium has a corrosive nature, it is desirable to use a material for the UBM pads 112 and surface mount pads 110 that are resistive to such corrosion. In embodiments, the material for the UBM pads 112 and the surface mount pads 110 may include, but is not limited to, tungsten, tantalum, nickel, niobium, titanium, and/or molybdenum.

As shown in FIG. 1, the solder joints are first applied to the UBM pads of the circuit chip 102 via electroplating, or other suitable process, such as a transfer method. In one embodiment, the solder joints are formed by an electroplating process in a gallium trichloride ($GaCl_3$) acid solution. The circuit chip 102 is then placed over the circuit board substrate 106 such that the solder joints 114 align with the surface mount pads 110. However, in other embodiments, the solder joints can be first applied to the surface mount pads 110, and the circuit chip then placed over the circuit board substrate such that the solder joints 114 align with the UBM pads 112. In yet other embodiments, a smaller solder joint 114 may be applied to both the surface mount pads 110 and the UBM pads 112. In such an embodiment, the circuit chip 102 is then placed over the circuit board substrate 106 such that the two sets of solder joints align with each other. Thus, each of the aforementioned techniques may be used in fabricating structures in accordance with embodiments of the present invention.

FIG. 2 is a structure 200 after a subsequent process step of applying a flux. As stated previously, similar elements may be referred to by similar numbers in various figures (FIGs) of the drawing, in which case typically the last two significant digits may be the same, the most significant digit being the number of the drawing figure (FIG). Thus, electronic circuit chip 202 of FIG. 2 is similar to electronic circuit chip 102 of FIG. 1, circuit board substrate 206 of FIG. 2 is similar to circuit board substrate 106 of FIG. 1, and so on. In FIG. 2, a flux 220 is applied to the structure such that the flux 220 is disposed between the circuit board substrate 206 and the electronic circuit chip 202, and in direct physical contact with each solder joint 214. A meniscus may form between the chip and the substrate. An important function of the flux is to remove an oxide layer that can rapidly form on the exposed surface of the gallium-containing solder joints 214. Preferably, the oxide layer should be removed to enable a good wettability and therefore a good reliability of the solder joining process. As shown in FIG. 2, the flux 220 is a liquid flux. In embodiments, the liquid flux may be comprised of hydrochloric acid (HCl). In other embodiments, the liquid flux may be comprised of $H_2SO_4$, hydrofluoric acid, and/or alkaline hydroxide solutions. In some embodiments, the HCl acid-based flux has a pH of around 2, and is applied on the gallium-containing solder joints 214 by capillary action. In yet other embodiments, the flux may be in gas form. In such embodiments, the gas flux may include formic acid ($CH_2O_2$) and/or chlorine gas.

FIG. 3 is a structure 300 after a subsequent step of metal alloy (solder joint) reflow. In such embodiments, the structure 300 is heated to a process temperature ranging from about 50 degrees Celsius to about 70 degrees Celsius. In particular embodiments, the structure 300 is heated to a process temperature of 60 degrees Celsius. This step evaporates the flux and reflows the solder joints 314 such that they bond to the surface mount pads 310 of circuit board substrate 306. Thus, embodiments include heating an applied metal alloy above the melting temperature of the metal alloy.

While the aforementioned embodiments describe the use of flux for oxide removal, in some embodiments, the oxide removal may be performed by another technique, such as plasma-based oxide removal, which can reduce/eliminate the need for the flux process step. In some embodiments, the structure 300 may be brought back to a cooler temperature such that solder joints 314 are in a solid state prior to starting the next process step.

FIG. 4 is a structure 400 in accordance with embodiments of the present invention including an underfill. In this process step, a soft underfill 437 is disposed between the circuit chip 402 and the circuit board substrate 406, and the soft underfill 437 is in direct physical contact with the solder joints 414. Thus, the underfill 437 is disposed around the plurality of solder joints 414 between the electronic circuit chip 402 and the circuit board substrate 406. The underfill 437 is non-conductive. A stiff material needs more force to deform compared to a soft material. The Young's modulus is a measure of the stiffness of a solid material. In embodiments, the soft underfill 437 has a Young's modulus below 1 GPa. Upon completion of the fabrication process, once the structure 400 reaches room temperature (between 20 degrees Celsius to 22 degrees Celsius), the solder joints 414 are in a solid state.

In some embodiments, the underfill material may be a silicone-based underfill material. The underfill material may have a low viscocity prior to curing. The underfill material may be applied near the edges of the circuit chip 402 and then the gaps between the solder joints 414 are filled by capillary action. In embodiments, the underfill material is cured at 80 degrees Celsius for 60 minutes.

Note that for the sake of drawing simplicity, the BEOL and FEOL layers of circuit chip 402 are not shown in FIG. 4 and the remaining structure figures.

FIG. 5 is a structure 500 in accordance with embodiments of the present invention during operation. During operation of the electronic circuit chip 502, the electronic circuit heats to an operating temperature. The operating temperature is a temperature on the UBM pads 512 that is sufficiently hot to cause the solder joints 514 to be in a liquid state, thereby forming a liquid metal interconnection. Although in a liquid state, the solder joints 514 are held in place by underfill 537, and thus, electrical connections between the electronic circuit chip 502 and the circuit board substrate 506 are maintained. Since the solder joints 514 are in a liquid state, they are resilient to mechanical stresses and shocks that could damage tin-based solder joints of prior art devices. Thus, embodiments provide a more ruggedized and robust interconnection, as the liquid metal interconnections formed by solder joints 514 are inherently immune to fatigue, cracking or other mechanical issues, as well as to electromigration damage. Additionally, the liquid metal interconnections are also compatible with soft underfill materials, thereby allowing a more substantial mechanical decoupling of the device and substrate, and consequently the production of low warpage packages with improved reliability and thermal performances (due to low thermal interface material strains). Another important advantage of disclosed embodiments is that the use of solder joints comprised of gallium allows a much lower reflow temperature than in a traditional tin-based alloy. It allows low temperature assembly which creates flexibility in circuit manufacture. For example, the electronic circuit chip 502 and/or the circuit board substrate 506 may include special purpose elements such as crystals, transducers, sensors, and the like, that are more prone to damage at the higher temperatures required for tin-based interconnections. Thus, embodiments of the present invention, with lower solder reflow temperatures (e.g. about 60 degrees Celsius for disclosed embodiments as compared with about 250 degrees Celsius for tin-based structures) can provide improved product yield in such cases.

FIG. 6 is a structure 600 in accordance with additional embodiments of the present invention including an adhesion layer. Structure 600 of FIG. 6 is similar to structure 400 of FIG. 4, with the exception that the UBM pads 612 and surface mount pads 610 are comprised of a first layer (641, 645) followed by a second layer (643, 647). In embodiments, the first layer is a layer of titanium followed by a second layer that is a layer of tungsten. In embodiments, each UBM pad 612 comprises a titanium layer 645, followed by a tungsten layer 647. Similarly, each surface mount pad 610 comprises a titanium layer 641, followed by a tungsten layer 643. Note, for the sake of drawing clarity, only one UBM pad and one surface mount pad show the reference numbers for the tungsten and titanium layers. In embodiments, forming the plurality of UBM pads and the plurality of surface mount pads is performed by sputtering titanium followed by sputtering tungsten. In embodiments, the titanium layers 645 and 641 serve as an adhesion layer to provide improved connection reliability between the solder joints and the materials for the circuit board interconnections 608 and metallization layer vias (not shown) within the electronic circuit chip 602. The use of titanium as the adhesion layer has the advantages of being a chemically resistant material while also capable of being etched with hydrogen peroxide. In some embodiments, layers 641 and 645 may be comprised of a titanium tungsten alloy. In alternative embodiments, layers 641 and 645 may be chromium while layers 647 and 643 are comprised of nickel.

FIG. 7 is a flowchart 700 indicating process steps for embodiments of the present invention. In process step 750, UBM pads are formed on the electronic circuit chip. In process step 752, surface mount pads are formed on the circuit board substrate. In process step 754 metal alloy (solder joint) connections are applied between the UBM pads of the electronic circuit chip and the surface mount pads of the circuit board substrate. In process step 756, an oxide removal is performed, such as by flux and/or plasma processes. In process step 758, the connections are reflowed, such that the solder joints are melted to form a joined connection such as shown with solder joints 314 of FIG. 3. In process step 760, a soft underfill is applied, such as shown with 437 of FIG. 4. Note that while flowchart 700 denotes a particular order, various steps may be performed in different orders, or may be performed simultaneously. For example, the process steps 750 and 752 may be performed in reverse order, or simultaneously in some embodiments. In some embodiments, additional steps may be added, or some steps may be removed. For example, in some alternative embodiments, the flux maybe applied to solder bumps that are affixed to the electronic chip before positioning the electronic chip over the circuit board substrate. The chip can then be placed in a chamber with an inert gas such as nitrogen or argon, and the flux then evaporated at a temperature ranging from about 50 degrees Celsius to about 70 degrees Celsius. The circuit board substrate can then be introduced to the chamber and the circuit board placed in contact with the electronic circuit such as shown in FIG. 1. In this embodiment, the inert gas prevents oxidation, and thus the flux is not present when the circuit board and electronic chip are positioned on each other. In this embodiment, an even lower reflow temperature is possible, since the melting point of gallium is about 29.76 degrees Celsius. Thus, in such embodiments, a reflow temperature in the range of 30 degrees Celsius to 40 degrees Celsius can be used. While this embodiment requires additional steps, it may be useful in certain cases where particularly temperature-sensitive components are on the circuit board, to provide improvements in overall product yield by performing the solder reflow at a further reduced temperature. The minimum solder reflow temperature is a function of the melting point of the metal alloy used for interconnections. Thus, if an embodiment uses a metal alloy with a melting point even lower than that of gallium, then an even lower solder flow temperature can be achieved.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A structure for flip chip connection between an electronic circuit chip and a circuit board substrate comprising:
   a plurality of under-bump metallurgy (UBM) pads disposed on the electronic circuit chip;
   a plurality of surface mount pads disposed on the circuit board substrate, wherein each UBM pad of the plurality of UBM pads is associated with a corresponding surface mount pad from the plurality of surface mount pads;
   a plurality of solder joints, wherein each solder joint is disposed between a UBM pad from the plurality of UBM pads and a corresponding surface mount pad;
   an underfill material disposed around the plurality of solder joints between the electronic circuit chip and the circuit board substrate;
   wherein the plurality of solder joints are comprised of a metal alloy, wherein the metal alloy has a melting temperature that is lower than an operating temperature of the electronic circuit chip.

2. The structure of claim 1, wherein the metal alloy comprises gallium.

3. The structure of claim 2, wherein the metal alloy further comprises indium.

4. The structure of claim 3, wherein the metal alloy comprises from 1 percent to 90 percent indium by weight.

5. The structure of claim 3, wherein the metal alloy comprises 25 percent indium by weight.

6. The structure of claim 1, wherein the underfill material comprises a silicone-based underfill material.

7. The structure of claim 1, wherein said underfill material has a Young's modulus below 1 GPa.

8. The structure of claim 1, wherein the plurality of UBM pads and the plurality of surface mount pads are comprised of tungsten.

9. The structure of claim 1, wherein the plurality of UBM pads and the plurality of surface mount pads are comprised of tantalum.

10. The structure of claim 1, wherein the plurality of UBM pads and the plurality of surface mount pads are comprised of nickel.

11. The structure of claim 1, wherein the plurality of UBM pads and the plurality of surface mount pads are comprised of titanium.

12. A method for making a flip chip connection between an electronic circuit chip and a circuit board substrate comprising:
    forming a plurality of under-bump metallurgy (UBM) pads on the electronic circuit chip;
    forming a plurality of surface mount pads on the circuit board substrate;
    forming a plurality of solder joints by applying a metal alloy to at least one of the plurality of UBM pads and the plurality of surface mount pads, wherein the metal alloy has a melting temperature that is lower than an operating temperature of the electronic circuit chip;
    aligning the plurality of UBM pads to the plurality of surface mount pads;
    performing an oxide removal on the metal alloy;
    heating the metal alloy above the melting temperature; and
    applying an underfill material such that the underfill material is disposed around the plurality of solder joints between the electronic circuit chip and the circuit board substrate.

13. The method of claim 12, wherein performing an oxide removal on the metal alloy comprises applying a flux to the metal alloy.

14. The method of claim 13, wherein applying the flux comprises applying a liquid flux.

15. The method of claim 13, wherein applying the flux comprises applying a gas flux.

16. The method of claim 14, wherein the liquid flux comprises HCl.

17. The method of claim 15, wherein the gas flux comprises chlorine gas.

18. The method of claim 12, wherein the metal alloy is electro-plated on the plurality of UBM pads.

19. The method of claim 12, wherein the metal alloy is electroplated on the plurality of surface mount pads.

20. The method of claim 12, wherein forming the plurality of UBM pads and the plurality of surface mount pads is performed by sputtering titanium followed by sputtering tungsten.

* * * * *